United States Patent
Rayaprolu et al.

(10) Patent No.: US 11,941,285 B2
(45) Date of Patent: Mar. 26, 2024

(54) MITIGATING SLOW READ DISTURB IN A MEMORY SUB-SYSTEM

(71) Applicant: Micron Technology, Inc., Boise, ID (US)

(72) Inventors: Vamsi Pavan Rayaprolu, San Jose, CA (US); Kishore Kumar Muchherla, Fremont, CA (US); Ashutosh Malshe, Fremont, CA (US); Giuseppina Puzzilli, Boise, ID (US); Saeed Sharifi Tehrani, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 17/235,216

(22) Filed: Apr. 20, 2021

(65) Prior Publication Data
US 2022/0334756 A1 Oct. 20, 2022

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
USPC ....................................................... 711/154
See application file for complete search history.

(56) References Cited

U.S. PATENT DOCUMENTS

| | | | | |
|---|---|---|---|---|
| 5,619,681 A | * | 4/1997 | Benhamida | G06F 13/385 703/23 |
| 8,688,904 B1 | * | 4/2014 | Ari | G06F 3/068 711/111 |
| 8,788,758 B1 | * | 7/2014 | de la Iglesia | G06F 12/123 711/136 |
| 8,914,581 B2 | * | 12/2014 | Hathaway | G06F 12/0888 711/133 |
| 9,530,436 B1 | * | 12/2016 | Masiewicz | G11B 5/02 |
| 9,613,676 B1 | * | 4/2017 | Wang | G11C 11/2275 |
| 2004/0027845 A1 | * | 2/2004 | Kim | G11C 15/00 365/49.1 |
| 2009/0049249 A1 | * | 2/2009 | Taylor | G06F 12/0891 711/135 |

(Continued)

*Primary Examiner* — Yaima Rigol
*Assistant Examiner* — Elias Young Kim
(74) *Attorney, Agent, or Firm* — Lowenstein Sandler LLP

(57) ABSTRACT

Disclosed is a system that comprises a memory device and a processing device, operatively coupled with the memory device, to perform operations that include, receiving a read request to perform a read operation on a block of the memory device; determining whether an entry corresponding to the block is stored in a data structure associated with the memory device; responsive to the entry being stored in the data structure, incrementing a counter associated with the block to track a number of read operations performed on the block of the memory device; resetting a timer associated with the block to an initial value, wherein the timer is to track a period of time that elapses since the read operation was performed on the block of the memory device; determining that the counter and the timer satisfy a first criterion; and responsive to determining that the counter and the timer satisfy the first criterion, removing the entry corresponding to the block from the data structure associated with the memory device.

20 Claims, 7 Drawing Sheets

(56) References Cited

U.S. PATENT DOCUMENTS

| | | | | |
|---|---|---|---|---|
| 2011/0093648 A1* | 4/2011 | Belluomini | ......... | G06F 12/0868 |
| | | | | 711/E12.008 |
| 2013/0191601 A1* | 7/2013 | Peterson | ............ | G06F 12/0868 |
| | | | | 711/E12.017 |
| 2013/0326115 A1* | 12/2013 | Goss | ..................... | G06F 3/0641 |
| | | | | 711/E12.008 |
| 2017/0255557 A1* | 9/2017 | Robinson | ............ | G06F 12/0833 |
| 2018/0285562 A1* | 10/2018 | Radhakrishnan | ..... | G06F 21/554 |
| 2019/0304555 A1* | 10/2019 | Lee | ........................ | G11C 16/10 |
| 2020/0233796 A1* | 7/2020 | Kim | ...................... | G06F 12/123 |
| 2021/0272619 A1* | 9/2021 | Ben-Rubi | ........... | G11C 11/4093 |
| 2022/0093183 A1* | 3/2022 | Kim | ........................ | G11C 16/30 |
| 2022/0328106 A1* | 10/2022 | Hwang | .............. | G11C 16/0433 |

\* cited by examiner

| Block Address | Counter | Timer (ms) |
|---|---|---|
| 101 | 10 | 10 |
| 102 | 0 | 8 |
| 103 | 500 | 10 |
| 104 | 30 | 6 |
| 105 | 256 | 0 |
| 106 | 0 | 10 |
| 107 | 0 | 0 |

FIG. 3

MITIGATING SLOW READ DISTURB IN A MEMORY SUB-SYSTEM

TECHNICAL FIELD

Embodiments of the disclosure relate generally to memory sub-systems, and more specifically, relate to mitigating slow read disturb in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 illustrates an example data structure containing entries of block addresses, counters, and timers associated with blocks in accordance with some embodiments of the present disclosure.

DETAILED DESCRIPTION

Figure 1:
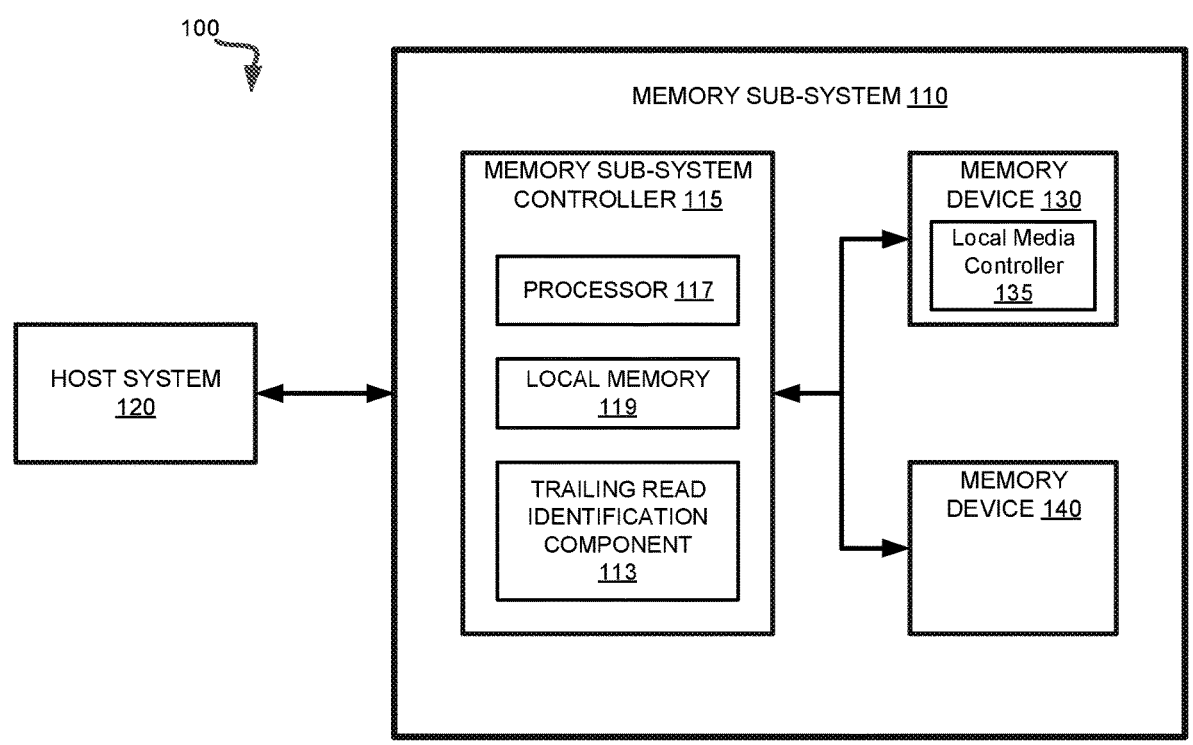
FIG. 1 illustrates an example computing system that includes a memory sub-system in accordance with some embodiments of the present disclosure.

Aspects of the present disclosure are directed to mitigating slow read disturb in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device at the memory sub-system. The data to be read or written, as specified by a host request, is hereinafter referred to as "host data." A host request can include logical address information (e.g., logical block address (LBA), namespace) for the host data, which is the location the host system associates with the host data. The logical address information can be part of metadata for the host data. Metadata can also include error handling (e.g., ECC codeword, parity code), data version (e.g., used to distinguish age of data written), valid bitmap (which LBAs or logical transfer units contain valid data), etc.

Each memory cell of the memory device has an associated threshold voltage. A memory cell can be programmed by applying a certain voltage to the memory cell, which results in an electric charge being held by the memory cell. A read voltage higher than the threshold voltage of the memory cell is applied in order to read the cell. Furthermore, in order to read the memory cell, a pass-through voltage is applied to the adjacent and nearby memory cells not being read, where the pass-through voltage has a higher voltage than the threshold voltage.

When reading the memory cell, the nearby or adjacent memory cells can experience what is known as read disturb. Traditional read disturb is the result of continually reading from one memory cell without intervening erase operations in a very fast manner, causing other nearby memory cells to change over time (e.g., become programmed). If too many read operations are performed on a memory cell, data stored at adjacent memory cells of the memory device can become corrupted or incorrectly stored at the memory cell, which can result in a higher error rate of the data stored at the memory cell. Traditional read disturb can increase the use of an error detection and correction operation (e.g., an error control operation) for subsequent operations (e.g., read and/or write) performed on the memory cell. The increased use of the error control operation can result in a degradation of the performance of a conventional memory sub-system. In addition, as the error rate for a memory cell or block continues to increase, it may even surpass the error correction capabilities of the memory sub-system, leading to an irreparable loss of the data. Furthermore, as more resources of the memory sub-system are used to perform the error control operation, fewer resources are available to perform other read operations or write operations.

The error rate associated with data stored at the block can increase due to traditional read disturb. Therefore, upon a threshold number of read operations being performed on the block, the memory sub-system can perform a data integrity check (also referred to herein as a "scan") to verify that the data stored at the block does not include any errors. During the data integrity check, one or more reliability statistics are determined for data stored at the block. One example of a reliability statistic is raw bit error rate (RBER). The RBER corresponds to a number of bit errors per unit of time that the data stored at the block experiences.

When there is a certain period of time that elapses between two consecutive read operations being performed on a memory cell, the effect is known as slow read disturb. During a read operation to a memory cell, nearby and adjacent memory cells have higher pass-through voltages. Once the read operation is performed on the memory cell, the nearby and adjacent memory cells slowly begin to discharge voltage. However, the nearby and adjacent cells can take a long period of time to reach ground voltage, requiring a soft programming operation and thus resulting in a degradation of the performance of the memory sub-system. Although the memory sub-system can perform a scan to detect errors in the data stored at a block, there is currently no way to reduce or remove the slow read disturb effect on a block. One possible solution is to issue a voltage discharge command when a read operation is performed on a block. The voltage discharge command results in the nearby and adjacent memory cells reaching ground voltage (e.g., a voltage of zero). However, this can leave the cells in a stable state, where electrons are distributed closer to the gates of the memory cells rather than equally distributed throughout the interior of the memory cells, thus increasing error rates associated with data stored on the cells. Furthermore, this increases the time it takes to perform a read operation on a block because an additional command must be performed, thus reducing the performance of the memory sub-system. Another possible solution is to issue an individual voltage discharge command that is separate from the read operation. Since it is unknown which block causes the slow read disturb error, the voltage discharge command could be issued at regular intervals. However, as explained above, the voltage discharge command can leave memory cells in a stable state, where electrons are distributed closer to the gates of the memory cells rather than equally distributed throughout the interior of the memory cells. The more voltage discharge commands that are performed, the more the cells are left in stable states, which increases the error rates associated with data stored on the cells.

Aspects of the present disclosure address the above and other deficiencies by mitigating slow read disturb in a memory sub-system by identifying a trailing read in a sequence of read operations and issuing a voltage discharge command to the block of a memory device associated with the trailing read. The trailing read is the last read operation to a block that was performed for some period of time. Identifying the trailing read determines the read operation likely to induce a slow read disturb error, so that a voltage discharge command can be issued to the block associated with that identified trailing read. As explained above, issuing a voltage discharge command when a read operation is performed on a block results in increased error rates and decreased performance. Furthermore, issuing a voltage discharge command at regular intervals can also increase error rates. Therefore, it is advantageous to be able to identify the trailing read and then issue a voltage discharge command only on the block associated with the trailing read in order to minimize the number of voltage discharge commands being issued, as well as to pinpoint the specific blocks causing the slow read disturb errors. In some embodiments, in order to identify the trailing read, the memory sub-system determines the least frequently used block by maintaining a counter to track the number of read operations being performed on a block of the memory device and a timer to track the period of time that elapses since a read operation was performed on the block. Each time a read operation is performed on the block of the memory device, the counter increments by a certain number (e.g., by 1), thus keeping track of the number of read operations being performed on the block. Each time the read operation is performed on the block, the timer counts down from an initial value (e.g., 10 ms), thus keeping track of the period of time that elapses between consecutive read operations. Determining that the counter is, for example, 0 (i.e., a read operation has not been performed on the block) and that the timer has counted down from, for example, an initial value of 10 ms to 0 ms (i.e., a 10 ms period of time has elapsed since a read operation was performed on the block) can identify the trailing read since the trailing read is the last read operation to a block that was performed for some period of time. A voltage discharge command can then be issued on the block since the block has been identified as the trailing read.

Advantages of the present disclosure include, but are not limited to an increase in performance. Identifying the trailing read and then issuing a voltage discharge command on the block associated with the trailing read results in a mitigation of the effects of slow read disturb, namely a degradation of the performance of the memory sub-system. Furthermore, by being able to target the precise read operation causing the slow read disturb errors, issuing the voltage discharge command does not need to result in a further decrease in performance, as explained above. Instead, the voltage discharge command can be issued only on the block associated with the trailing read, thus improving the performance of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDEVIMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a trailing read identification component 113 that can mitigate slow read disturb errors in the memory sub-system 110 by identifying the trailing read and issuing a voltage discharge command to the block associated with the trailing read. In some embodiments, the memory sub-system controller 115 includes at least a portion of the trailing read identification component 113. In some embodiments, the trailing read identification component 113 is part of the host system 110, an application, or an operating system. In other embodiments, local media controller 135 includes at least a portion of trailing read identification component 113 and is configured to perform the functionality described herein.

The trailing read identification component 113 can receive a read request to perform a read operation on a block of memory device 130. Upon receiving the read request, the trailing read identification component 113 can determine whether an entry corresponding to the block is stored in a data structure associated with the block (e.g., in local memory 119). In one embodiment, the data structure can be a table, and the entry can include a block address corresponding to the block. The trailing read identification component 113 can also store a counter and timer in the entry of the data structure. The trailing read identification component 113 can increment the counter by a certain amount (e.g., by 1) every time a read operation is performed on the corresponding block. The trailing read identification component 113 can also start the timer associated with the block at an initial value (e.g., 10 ms) and count down the timer. The trailing read identification component 113 can decrement the counter by a certain amount (e.g., by 1) when the timer reaches some final value (e.g., 0). When the respective values of the counter and the timer both satisfy a certain criterion (e.g., both are 0), the trailing read identification component 113 can remove the entry corresponding to the block from the data structure since the block is the least frequently used block in terms of read operations performed on the block. As described above, the least frequently used block is the block associated with the trailing read (e.g., the read operation that results in the slow read disturb errors). Therefore, the trailing read identification component 113 can issue a voltage discharge command to the block, thus causing the block to reach a ground voltage, thereby mitigating slow read disturb. Further details with regards to the operations of the trailing read identification component 113 are described below.

Figure 2:
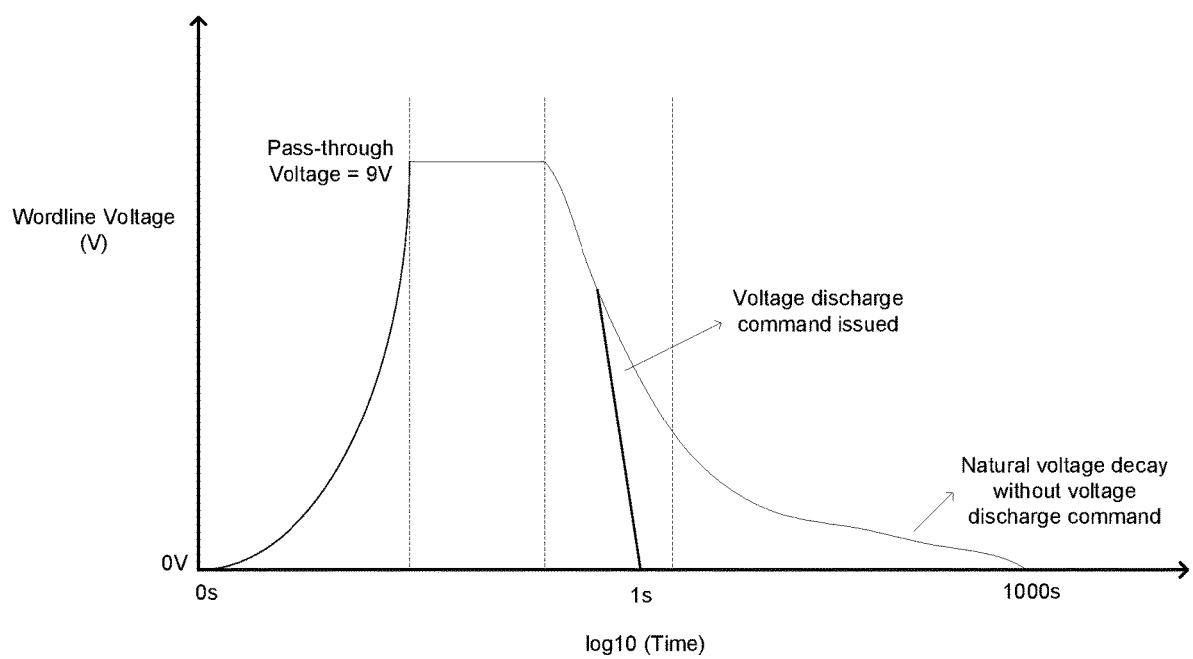
FIG. 2 illustrates an example graph of the effect of slow read disturb on the pass-voltage of a memory cell and the effect of issuing a voltage discharge command on the memory cell.

FIG. 2 illustrates an example graph of the effect of slow read disturb on the voltage of a memory cell and the effect of issuing a voltage discharge command on the voltage of the memory cell. As described above, slow read disturb occurs when a certain period of time elapses between two consecutive read operations being performed on a memory cell. During a read operation to a memory cell, nearby and adjacent memory cells have higher pass-through voltages. Once the read operation is performed to the memory cell, the nearby and adjacent memory cells slowly begin to discharge voltage. However, the nearby and adjacent cells can take a long period of time to reach ground voltage, requiring a soft programming operation and thus resulting in a degradation of the performance of a memory sub-system. For example, FIG. 2 illustrates a nearby and/or adjacent memory cell that has a pass-through voltage of 9V. Once the read operation is performed, the pass-through voltage of the nearby and/or adjacent memory cell naturally decays. As FIG. 2 depicts, this rate of natural decay of the pass-through voltage is gradual and then slows down significantly towards the end, requiring, for example, 1000 seconds to reach ground voltage (e.g., 0V). In contrast, when a voltage discharge command is issued to the block containing the nearby and/or adjacent memory cell, the pass-through voltage can reach ground voltage in a shorter period of time, such as 1 second.

As described in FIG. 1, the trailing identification component 113 can identify the trailing read, i.e., the read operation to a block after which there is no other read operation for some period of time. The trailing identification component 113 can then issue the voltage discharge command to the block associated with the trailing read. Further details with regards to identifying the trailing read and issuing the voltage discharge command are described below.

FIG. 3 illustrates an example data structure containing entries of block addresses, counters, and timers associated with blocks in accordance with some embodiments of the present disclosure. As described in FIG. 1 and in more details herein below, the trailing read identification component 113 can store entries corresponding to blocks in a data structure. In one embodiment, the entries can be a block address, a counter, and a timer associated with a block. In one embodiment, the data structure can be a table. The data structure can be stored in the memory device 130 and/or 140. In one embodiment, the data structure can hold as many entries as the memory device 130 and/or 140 have the capacity and resources to hold. In an illustrative example, at block address 107 in FIG. 3, the counter and the timer associated with the entry both have a value of 0. As described herein below, when the counter and the timer reach a final value, e.g., a value of 0, the entry associated with the counter and the timer is removed from the data structure. A voltage discharge command can then be issued to the block corresponding to the block address associated with the entry in the data structure, as described in more detail herein below with regards to FIG. 4 and FIG. 5.

Figure 4:
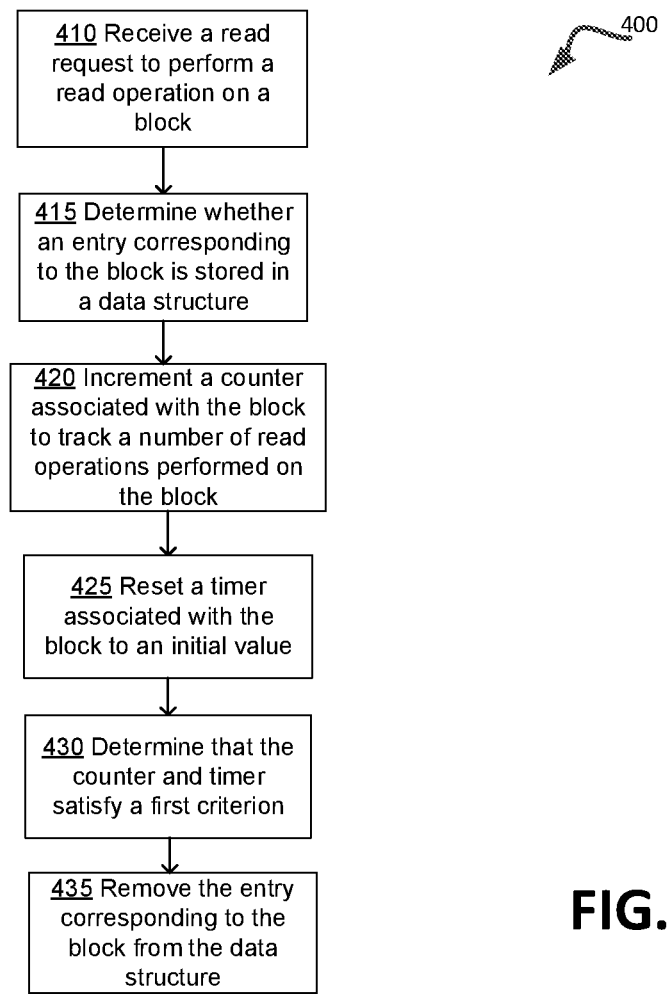
FIG. 4 is a flow diagram of an example method 400 to mitigate slow read disturb in a memory sub-system in accordance with some embodiments of the present disclosure.

FIG. 4 is a flow diagram of an example method 400 to mitigate slow read disturb in a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the trailing read identification component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a read request to perform a read operation on a block of the memory device. In an illustrative example, the read request can be received from the host system, such as the host system 120 illustrated in FIG. 1. The data to be read, as specified by a read request, is hereinafter referred to as "host data." The read request can include logical address information (e.g., logical block address (LBA), namespace) for the host data, which is the location the host system associates with the host data. The logical address information (e.g., LBA, namespace) can be part of metadata for the host data. Metadata can also include error handling (e.g., ECC codeword, parity code), data version (e.g., used to distinguish age of data written), valid bitmap (which LBAs or logical transfer units contain valid data), etc.

At operation 415, the processing logic determines whether an entry corresponding to the block is stored in a data structure. In an illustrative example, the data structure can be the data structure (i.e., the table) illustrated in FIG. 3. In an illustrative example, determining whether the entry corresponding to the block is stored in the data structure includes decoding the physical address associated with the block on which the read operation is to be performed and looking up the virtual block address in the data structure. In an illustrative example, the entry can include the block address of the block. The entry can also include a counter and timer associated with the block. In an illustrative example, if the processing logic determines that the entry corresponding to the block is not stored on the data structure and the data structure is currently full (i.e., there is not sufficient space to add an additional entry), the processing logic can remove an entry corresponding to another block from the data structure and create the entry corresponding to the block. The processing logic can identify the entry corresponding to another block from the data structure by comparing the counters associated with each entry in the data structure and determining the counter with the highest value (i.e., the block associated with the highest number of reads). The processing logic can remove the entry associated with the determined counter with the highest value. Removing the entry can include replacing the entry with the entry corresponding to the block not stored on the data structure. The data structure can be stored on a memory device, e.g., the memory device 130 and/or 140 of FIG. 1.

At operation 420, the processing logic increments a counter associated with the block to track a number of read operations performed on the block. In an illustrative example, the processing logic stores the counter in the entry corresponding to the block in the data structure with the memory device. In an illustrative example, the counter has an initial value of 0. In an illustrative example, the initial value is not a set value and can be changed at any time. The processing logic can increment the counter by adding a value of 1 to a current value of the counter each time a read operation is performed on the block of the memory device.

At operation 425, the processing logic resets a timer associated with the block to an initial value. In an illustrative example, the processing logic stores the timer in the entry corresponding to the block in the data structure with the memory device. The timer can track a period of time that elapses since the read operation was performed on the block of the memory device. For example, the initial value of the timer can be set to 10 ms. In an illustrative example, the initial value is not a set value and can be changed at any time. The timer can count down from the initial value to a final value, e.g., 0 ms. In an illustrative example, the processing logic determines whether the timer reaches the final value. Responsive to determining that the timer reaches the final value, the processing logic decrements the counter by a defined amount. The defined amount can be 1.

At operation 430, the processing logic determines that the counter and the timer satisfy a first criterion. In an illustrative example, determining that the counter and the timer satisfy a first criterion includes determining that the counter and the timer have both reached a final value. In an illustrative example, the final value for both the counter and the timer is 0. In an illustrative example, the final value can be different numbers for the counter and the timer, e.g., the final value for the counter can be 1 and the final value for the timer can be 0. In an illustrative example, the final value is not a set value and can be changed at any time.

At operation 435, the processing logic removes the entry corresponding to the block from the data structure associated with the memory device. In some embodiments, removing the entry corresponding to the block from the data structure includes determining that the counter and the timer satisfy the first criterion. Responsive to determining that the counter and timer satisfy the first criterion, the processing logic issues a voltage discharge command to the block. The voltage discharge command can result in the block reaching ground voltage, i.e., 0V. In some embodiments, removing the entry corresponding to the block from the data structure includes determining that the counter satisfies a second criterion. Determining that the counter satisfies the second criterion can include identifying the counter with the highest value (i.e., the block associated with the highest number of reads).

Figure 5:
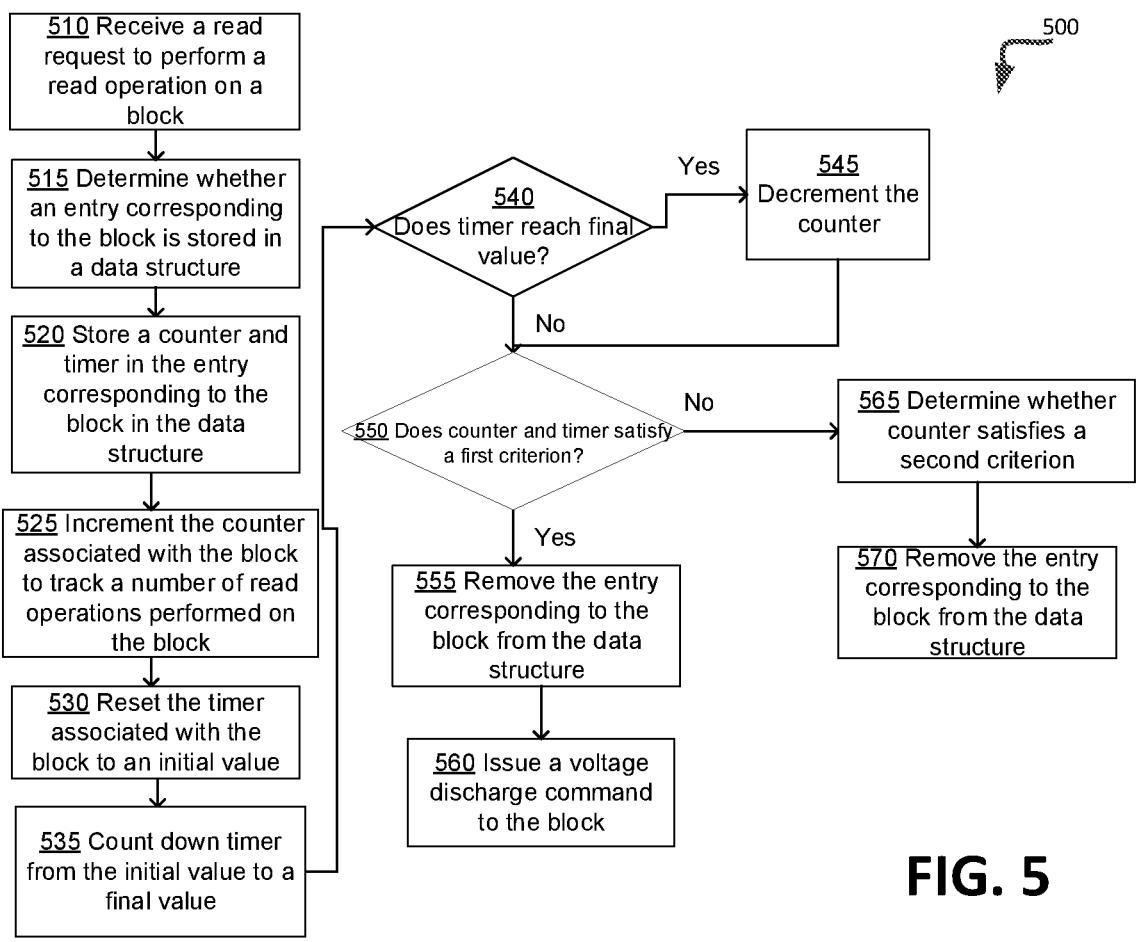
FIG. 5 is a flow diagram of an example method 500 to mitigate slow read disturb in a memory sub-system in accordance with some embodiments of the present disclosure.

FIG. 5 is a flow diagram of an example method 500 to mitigate slow read disturb in a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the trailing read identification component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a read request to perform a read operation on a block of the memory device. In an illustrative example, the read request can be received from the host system, such as the host system 120 illustrated in FIG. 1. The data to be read, as specified by a read request, is hereinafter referred to as "host data." The read request can include logical address information (e.g., logical block address (LBA), namespace) for the host data, which is the location the host system associates with the host data. The logical address information (e.g., LBA, namespace) can be part of metadata for the host data. Metadata can also include error handling (e.g., ECC codeword, parity code), data version (e.g., used to distinguish age of data written), valid bitmap (which LBAs or logical transfer units contain valid data), etc.

At operation 515, the processing logic determines whether an entry corresponding to the block is stored in a data structure. In an illustrative example, the data structure can be the data structure (i.e., the table) illustrated in FIG. 3. In an illustrative example, determining whether the entry corresponding to the block is stored in the data structure includes decoding the physical address associated with the block on which the read operation is to be performed and looking up the virtual block address in the data structure. In an illustrative example, the entry can include the block address of the block. The entry can also include a counter and timer associated with the block. In an illustrative example, if the processing logic determines that the entry corresponding to the block is not stored on the data structure and the data structure is currently full (i.e., there is not sufficient space to add an additional entry), the processing logic can remove an entry corresponding to another block from the data structure and create the entry corresponding to the block. The processing logic can identify the entry corresponding to another block from the data structure by comparing counters associated with each entry in the data structure (as described in more detail at operation 520 below) and determining the counter with the highest value (i.e., the block associated with the highest number of reads). The processing logic can remove the entry associated with the determined counter with the highest value. Removing the entry can include replacing the entry with the entry corresponding to the block not stored on the data structure. The data structure can be stored on a memory device, e.g., the memory device 130 and/or 140 of FIG. 1.

At operation 520, the processing logic stores a counter and timer in the entry corresponding to the block in the data structure. In an illustrative example, the data structure can be the data structure (i.e., the table) illustrated in FIG. 3. The counter and the timer can be stored in the same entry storing the block address of the block. The data structure can be stored on a memory device, e.g., the memory device 130 and/or 140 of FIG. 1.

At operation 525, the processing logic increments the counter associated with the block to track a number of read operations performed on the block. In an illustrative example, the processing logic stores the counter in the entry corresponding to the block in the data structure with the memory device. For example, the counter has an initial value of 0. In an illustrative example, the initial value is not a set value and can be changed at any time. The processing logic can increment the counter by adding a value of 1 to a current value of the counter each time a read operation is performed on the block of the memory device.

At operation 530, the processing logic resets the timer associated with the block to an initial value. In an illustrative example, the processing logic stores the timer in the entry corresponding to the block in the data structure with the memory device. The timer can track a period of time that elapses since the read operation was performed on the block of the memory device. In an illustrative example, the initial value of the timer can be set to 10 ms. The initial value can be a value not a set value and can be changed at any time.

At operation 535, the processing logic counts down the timer from the initial value to a final value. In an illustrative example, the timer can count down from the initial value to the final value, e.g., 0 ms. In an illustrative example, the final value is not a set value and can be changed at any time. The processing logic can determine whether the timer reaches the final value. Responsive to determining that the timer reaches the final value, the processing logic decrements the counter by a defined amount. The defined amount can be 1 or any other value.

At operation 540, the processing logic determines whether the timer reaches the final value. In an illustrative example, the processing logic can determine whether the timer reaches the final value by checking the value of the timer stored in the entry in the data structure. The final value can be, e.g., 0 ms.

At operation 545, responsive the determining that the timer reaches the final value, the processing logic decrements the counter. For example, the processing logic can decrease the value of the counter by, e.g., 1.

At operation 550, if the processing logic determines that the timer does not reach the final value, the processing logic determines whether the counter and timer satisfy a first criterion. In an illustrative example, determining that the counter and the timer satisfy a first criterion includes determining that the counter and the timer have both reached a final value. In an illustrative example, the final value for both the counter and the timer is 0. In an illustrative example, the final value can be different numbers for the counter and the timer, e.g., the final value for the counter can be 1 and the final value for the timer can be 0.

At operation 565, if the processing logic determines that the counter and timer do not satisfy the first criterion, the processing logic determines whether the counter satisfies a second criterion. Determining that the counter satisfies the second criterion can include identifying the counter with the highest value (i.e., the block associated with the highest number of reads).

At operation 570, responsive to determining that the counter satisfies the second criterion, the processing logic removes the entry corresponding to the block from the data structure.

At operation 555, if the processing logic determines that the counter and timer satisfy the first criterion, the processing logic removes the entry corresponding to the block from the data structure.

At operation 560, responsive to operation 555, the processing logic issues a voltage discharge command to the block. The voltage discharge command can result in the block reaching ground voltage, i.e., 0V.

Figure 6:
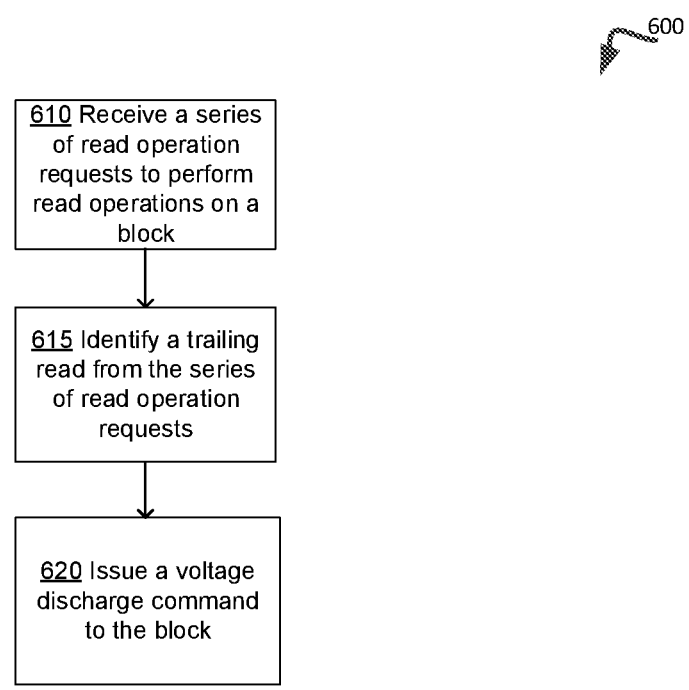
FIG. 6 is a flow diagram of an example method 600 to mitigate slow read disturb in a memory sub-system in accordance with some embodiments of the present disclosure.

FIG. 6 is a flow diagram of an example method 600 to mitigate slow read disturb in a memory sub-system, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the trailing read identification component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives a series of read operation requests to perform read operations on a block of a memory device. In an illustrative example, the series of read requests can be received from the host system, such as the host system 120 illustrated in FIG. 1. The data to be read, as specified by each read request in the series of read requests, is hereinafter referred to as "host data." Each read request in the series of read requests can include logical address information (e.g., logical block address (LBA), namespace) for the host data, which is the location the host system associates with the host data. The logical address information (e.g., LBA, namespace) can be part of metadata for the host data. Metadata can also include error handling (e.g., ECC codeword, parity code), data version (e.g., used to distinguish age of data written), valid bitmap (which LBAs or logical transfer units contain valid data), etc.

At operation 615, the processing logic identifies a trailing read from the series of read operation requests. In an illustrative example, in order to identify the trailing read from the series of read operation requests, the processing logic determines whether an entry corresponding to the block is stored in a data structure. The data structure can be the data structure (i.e., the table) illustrated in FIG. 3. In an illustrative example, determining whether the entry corresponding to the block is stored in the data structure includes decoding the physical address associated with the block on which each read operation of the series of read operation requests is to be performed and looking up the virtual block address in the block structure. In an illustrative example, the entry can include the block address of the block. The entry can also include a counter and timer associated with the block. In an illustrative example, if the processing logic determines that the entry corresponding to the block is not stored on the data structure and the data structure is currently full (i.e., there is not sufficient space to add an additional entry), the processing logic can remove an entry corresponding to another block from the data structure and create the entry corresponding to the block. The processing logic can identify the entry corresponding to another block from the data structure by comparing the counters associated with each entry in the data structure and determining the counter with the highest value (i.e., the block associated with the highest number of reads). The processing logic can remove the entry associated with the determined counter with the highest value. Removing the entry can include replacing the entry with the entry corresponding to the block not stored on the data structure. The data structure can be stored on a memory device, e.g., the memory device 130 and/or 140 of FIG. 1.

Furthermore, at operation 615, the processing logic can increment a counter associated with the block to track a number of read operations performed on the block. In an illustrative example, the processing logic stores the counter in the entry corresponding to the block in the data structure with the memory device. In an illustrative example, the initial value is not a set value and can be changed at any time. The processing logic can increment the counter by adding a value of 1 to a current value of the counter each time a read operation on the block of the memory device. The processing logic can also reset a timer associated with the block to an initial value. In an illustrative example, the processing logic stores the timer in the entry corresponding the block in the data structure with the memory device. The timer can track a period of time that elapses since the read operation was performed on the block of the memory device. For example, the initial value of the timer can be set to 10 ms. In an illustrative example, the initial value is not a set value and can be changed at any time. The timer can count down from the initial value to a final value, e.g., 0 ms. In an illustrative example, the processing logic determines whether the timer reaches the final value. Responsive to determining that the timer reaches the final value, the processing logic decrements the counter by a defined amount. The defined amount can be 1. In an illustrative example, the processing logic determines that the counter and the timer satisfy a first criterion. Determining that the counter and the timer satisfy a first criterion can include determining that the counter and the timer have both reached a final value. In an illustrative example, the final value for both the counter and the timer is 0. In an illustrative example, the final value can be different numbers for the counter and the timer, e.g., the final value for the counter can be 1 and the final value for the timer can be 0. In an illustrative example, the final value is not a set value and can be changed at any time. The processing logic can remove the entry corresponding to the block from the data structure associated with the memory device. In an illustrative example, removing the entry corresponding to the block from the data structure includes determining that the counter satisfies a second criterion. Determining that the counter satisfies the second criterion can include identifying the counter with the highest value (i.e., the block associated with the highest number of reads).

At operation 620, the processing logic issues a voltage discharge command to the block of the memory device. In an illustrative example, issuing the voltage discharge command includes removing the entry corresponding to the block from the data structure associated with the memory device. Removing the entry corresponding to the block from the data structure can include determining that the counter and the timer satisfy the first criterion as described at operation 615.

Figure 7:
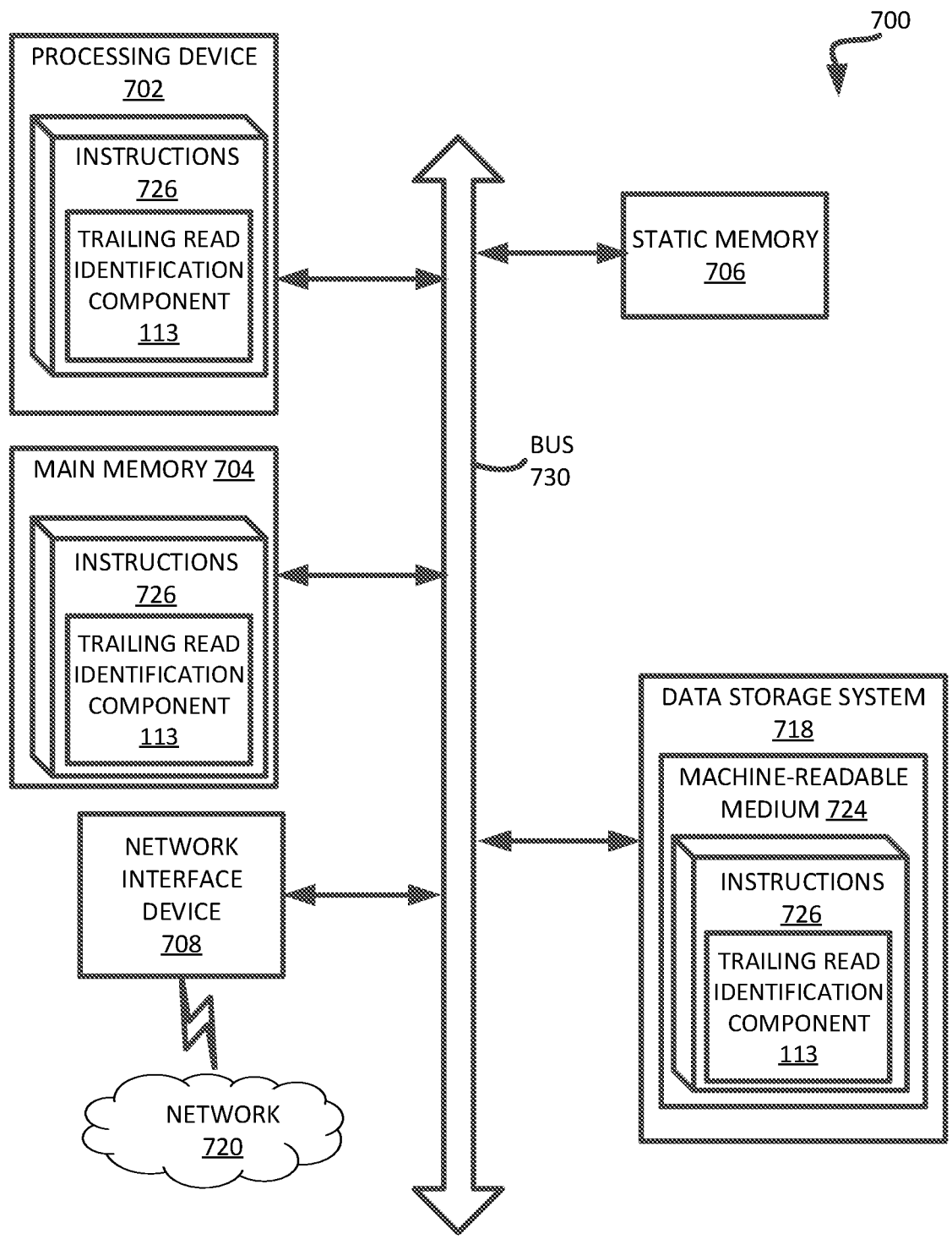
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the trailing read identification component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a trailing read identification component (e.g., the trailing read identification component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, to perform operations comprising:
   receiving a read request to perform a read operation on a block of the memory device;
   determining whether an entry corresponding to the block is stored in a data structure associated with the memory device;
   responsive to the entry being stored in the data structure, incrementing a counter associated with the block to track a number of read operations performed on the block of the memory device;
   resetting a timer associated with the block to an initial value, wherein the timer is to track a period of time that elapses since the read operation was performed on the block of the memory device;
   determining that the counter and the timer satisfy a first criterion, wherein the first criterion corresponds to respective final values of the counter and the timer, and wherein satisfying the first criterion is indicative of a minimum number of read operations performed on the block; and
   responsive to determining that the counter and the timer satisfy the first criterion, issuing a voltage discharge command to the block, wherein issuing the voltage discharge command results in the block reaching a ground voltage.

2. The system of claim 1, wherein the counter and the timer are stored in the entry corresponding to the block in the data structure with the memory device.

3. The system of claim 1, further comprising, responsive to determining that the counter and the timer satisfy the first criterion, removing the entry corresponding to the block from the data structure associated with the memory device.

4. The system of claim 3, wherein removing the entry corresponding to the block from the data structure associated with the memory device is responsive to determining that the counter satisfies a second criterion.

5. The system of claim 1, wherein determining that the counter and the timer satisfy a first criterion comprises determining that the counter and the timer have both reached the respective final values.

6. The system of claim 1, wherein the timer is to count down from the initial value to the respective final value of the timer, and wherein the processing device to perform operations further comprising:
   responsive to determining that the timer reaches the respective final value of the timer, decrementing the counter by a defined amount.

7. The system of claim 1, wherein the processing device to perform operations further comprising:
   responsive to the entry corresponding to the block not being stored in the data structure, removing an entry corresponding to another block from the data structure associated with the memory device and creating the entry corresponding to the block in the data structure.

8. A method comprising:
   receiving a read request to perform a read operation on a block of a memory device;
   determining that an entry corresponding to the block is stored in a data structure associated with the memory device;
   responsive to the entry being stored in the data structure, incrementing a counter associated with the block to track a number of read operations performed on the block of the memory device;
   resetting a timer associated with the block to an initial value, wherein the timer is to track a period of time that elapses since the read operation was performed on the block of the memory device;
   determining that the counter and the timer satisfy a first criterion, wherein the first criterion corresponds to respective final values of the counter and the timer, and wherein satisfying the first criterion is indicative of a minimum number of read operations performed on the block; and
   responsive to determining that the counter and the timer satisfy the first criterion, issuing a voltage discharge command to the block, wherein issuing the voltage discharge command results in the block reaching a ground voltage.

9. The method of claim 8, wherein the counter and the timer are stored in the entry corresponding to the block in the data structure associated with the memory device.

10. The method of claim 8, further comprising, responsive to determining that the counter and the timer satisfy the first criterion, removing the entry corresponding to the block from the data structure associated with the memory device.

11. The method of claim 10, wherein removing the entry corresponding to the block from the data structure associated with the memory device is responsive to determining that the counter satisfies a second criterion.

12. The method of claim 8, wherein determining that the counter and the timer satisfy a first criterion comprises determining that the counter and the timer have both reached the respective final values.

13. The method of claim 8, wherein the timer is to count down from the initial value to the respective final value of the timer, and wherein, responsive to determining that the timer reaches the respective final value of the timer, decrementing the counter by a defined amount.

14. The method of claim 8, further comprising:
responsive to the entry corresponding to the block not being stored in the data structure, removing an entry corresponding to another block from the data structure associated with the memory device and creating the entry corresponding to the block in the data structure.

15. A non-transitory computer-readable storage medium comprising instructions that, when executed by a processing device, cause the processing device to perform operations comprising:
receiving a series of read operation requests to perform read operations on a block of a memory device;
determining whether an entry corresponding to the block is stored in a data structure associated with the memory device;
responsive to the entry being stored in the data structure, incrementing a counter associated with the block to track a number of read operations performed on the block of the memory device;
resetting a timer associated with the block to an initial value, wherein the timer is to track a period of time that elapses since a read operation was performed on the block of the memory device;
identifying a trailing read from the series of read operation requests;
determining that the trailing read satisfies a first criterion, wherein the first criterion corresponds to respective final values of the counter and the timer associated with the block, and wherein satisfying the first criterion is indicative of a minimum number of read operations performed on the block; and
responsive to determining that the trailing read satisfies the first criterion, issuing a voltage discharge command to the block, wherein issuing the voltage discharge command results in the block reaching a ground voltage.

16. The non-transitory computer-readable storage medium of claim 15, wherein identifying the trailing read from the series of read operation requests comprises:
determining that the counter and the timer satisfy the first criterion; and
responsive to determining that the counter and the timer satisfy the first criterion, removing the entry corresponding to the block from the data structure associated with the memory device.

17. The non-transitory computer-readable storage medium of claim 16, wherein determining that the counter and the timer satisfy the first criterion comprises determining that the counter and the timer have both reached the respective final values.

18. The non-transitory computer-readable storage medium of claim 16, wherein removing the entry corresponding to the block from the data structure associated with the memory device is responsive to determining that the counter satisfies a second criterion.

19. The non-transitory computer-readable storage medium of claim 16, wherein the timer is to count down from the initial value to the respective final value of the timer, and wherein, responsive to determining that the timer reaches the respective final value of the timer, decrementing the counter by a defined amount.

20. The non-transitory computer-readable storage medium of claim 16, wherein the processing device to perform operations further comprising:
responsive to the entry corresponding to the block not being stored in the data structure, removing an entry corresponding to another block from the data structure associated with the memory device and creating the entry corresponding to the block in the data structure.

* * * * *